US009222850B2

(12) United States Patent
Couch et al.

(10) Patent No.: US 9,222,850 B2
(45) Date of Patent: Dec. 29, 2015

(54) INTEGRATED OPTICS REFLECTOMETER

(71) Applicant: AX INSTRUMENTS, LLC, Danville, VA (US)

(72) Inventors: Philip R. Couch, Cotleigh Honiton (GB); Kent A. Murphy, Troutville, VA (US); Michael F. Gunther, Blacksburg, VA (US); Charles B. Gause, Providence, NC (US)

(73) Assignee: AXONOPTICS, LLC, Harrisonburg, VA (US)

( * ) Notice: Subject to any disclaimer, the term of this patent is extended or adjusted under 35 U.S.C. 154(b) by 0 days.

(21) Appl. No.: 13/829,728

(22) Filed: Mar. 14, 2013

(65) Prior Publication Data

US 2014/0268111 A1 Sep. 18, 2014

(51) Int. Cl.
*G01M 11/00* (2006.01)
*H01S 5/0687* (2006.01)
*H01S 5/12* (2006.01)

(52) U.S. Cl.
CPC .............. *G01M 11/31* (2013.01); *H01S 5/0687* (2013.01); *H01S 5/12* (2013.01)

(58) Field of Classification Search
USPC ............. 356/73.1, 460, 461, 477; 372/32, 19, 372/29.02
See application file for complete search history.

(56) References Cited

U.S. PATENT DOCUMENTS

| | | | |
|---|---|---|---|
| 5,292,376 A * | 3/1994 | Suse et al. ..................... 136/239 |
| 5,323,008 A * | 6/1994 | Studholme et al. ........ 250/458.1 |
| 5,844,235 A | 12/1998 | Tachikawa et al. |
| 6,215,830 B1 * | 4/2001 | Temerinac et al. ........... 375/326 |
| 6,490,538 B1 | 12/2002 | Glombitzs et al. |
| 6,516,014 B1 * | 2/2003 | Sellin et al. ..................... 372/32 |
| 6,654,394 B1 * | 11/2003 | Sellin et al. ..................... 372/32 |
| 6,661,941 B1 * | 12/2003 | Yao ................................ 385/15 |
| 7,092,589 B2 | 8/2006 | Kish, Jr. et al. |
| 7,228,024 B2 | 6/2007 | Wang |
| 7,515,276 B2 | 4/2009 | Froggatt et al. |
| 7,805,082 B1 | 9/2010 | Whiteaway |
| 8,004,686 B2 | 8/2011 | Froggatt et al. |
| 8,054,455 B2 | 11/2011 | Sugaya et al. |

(Continued)

OTHER PUBLICATIONS

International Search Report and Written Opinion issued by the International Search Authority dated Jul. 11, 2013 in PCT/US2013/031657 (10 Pgs).

(Continued)

*Primary Examiner* — Sang Nguyen
(74) *Attorney, Agent, or Firm* — Buchanan Ingersoll & Rooney PC (57) ABSTRACT

An apparatus includes a laser source configured to output laser light at a target frequency, and a measurement unit configured to measure a deviation between an actual frequency outputted by the laser source at a current period of time and the target frequency of the laser source. The apparatus includes a feedback control unit configured to, based on the measured deviation between the actual and target frequencies, control the laser source to maintain a constant frequency of laser output from the laser source so that the frequency of laser light transmitted from the laser source is adjusted to the target frequency. The feedback control unit can control the laser source to maintain a linear rate of change in the frequency of its laser light output, and compensate for characteristics of the measurement unit utilized for frequency measurement. A method is provided for performing the feedback control of the laser source.

18 Claims, 9 Drawing Sheets

(56) References Cited

U.S. PATENT DOCUMENTS

| | | |
|---|---|---|
| 8,144,738 B2 | 3/2012 | Sato et al. |
| 8,149,419 B2 | 4/2012 | Fan et al. |
| 8,331,409 B1* | 12/2012 | Liang et al. ............ 372/32 |
| 2003/0103552 A1 | 6/2003 | Chi et al. |
| 2005/0213103 A1 | 9/2005 | Evertee et al. |
| 2006/0013530 A1* | 1/2006 | Shibata ............ 385/27 |
| 2007/0127932 A1 | 6/2007 | Qi et al. |
| 2008/0092648 A1* | 4/2008 | Zhou et al. ........ 73/335.01 |
| 2010/0097615 A1 | 4/2010 | Fan et al. |
| 2011/0096335 A1 | 4/2011 | Levin et al. |
| 2011/0110659 A1 | 5/2011 | Eiselt |
| 2011/0150016 A1 | 6/2011 | Park et al. |
| 2011/0249973 A1 | 10/2011 | Donlagic et al. |
| 2012/0174677 A1 | 7/2012 | Hill |
| 2012/0262721 A1 | 10/2012 | Rakuljic et al. |
| 2014/0070072 A1* | 3/2014 | Kuo ............ 250/205 |

OTHER PUBLICATIONS

P. Oberson et al., "Optical Frequency Domain Reflectometry with a Narrow Linewidth Fiber Laser" IEEE Photonics Technology Letters, vol. 12, No. 7, Jul. 2000, pp. 867-869.

Notification of Transmittal of the International Search Report (Forms PCT/ISA/220 and PCT/ISA/210) and the Written Opinion of the International Searching Authority (Form PCT/ISA/237) issued on Jul. 11, 2013, in corresponding International Application No. PCT/US2013/031657. (10 pages).

Oberson et al., "Optical Frequency Domain Reflectometry with a Narrow Linewidth Fiber Laser" IEEE Photonics Technology Letters, (Jul. 2000), vol. 12, No. 7, pp. 867-869.

* cited by examiner

INTEGRATED OPTICS REFLECTOMETER

RELATED APPLICATIONS

This application claims priority to U.S. Provisional Application No. 61/610,533, filed on Mar. 14, 2012. The entire contents of U.S. Provisional Application No. 61/610,533 are hereby incorporated by reference in their entirety.

STATEMENT REGARDING FEDERALLY SPONSORED RESEARCH OR DEVELOPMENT

At least part of the present disclosure was conceived or first actually reduced to practice under a contract with the U.S. Department of Energy.

FIELD

The present disclosure relates to an apparatus and method for testing the optical integrity of fiber optic (FO) installations. More particularly, the present disclosure relates to an integrated optics reflectometer and associated method which can test the optical integrity of FO installations at high resolution (e.g., less than 1 cm, such as less than 2 mm) at a range of one or more kilometers inexpensively and effectively in a single sweep.

BACKGROUND

Optical communication techniques, including fiber optics and lasers, are the workhorses of the Internet and high-capacity computing. Meeting the computing and telecommunications needs of the next decades will require advances across a broad front of research and development, including optical signal generation, transmission, switching and routing, as well as intelligent and seamless networking. Although institutions and companies have access to such rapidly growing, high-speed global telecommunication networks, the infrastructure is not yet in place to provide the individual user access that fully exploits the power of light in FO installations.

Known FO diagnostic instruments consist of two expensive categories: 1) long-range units with relatively low resolution for telecommunications and large data networks, where such units generally use optical time domain reflectometery (OTDR) and provide tens of km of span with a resolution of 0.1 to 1 m; and 2) very-high resolution laboratory instruments which utilize optical frequency domain reflectometery (OFDR) providing less than 1 mm resolution.

As used herein, the terms "coherent" or "coherence" mean a uniform wavelength (or frequency). Thus, the term "coherence length" means a distance of air over which the wavelength of laser light is uniform in air.

OFDRs use a tunable wavelength high-coherence laser source. OFDR lasers can provide a wide optical frequency sweep which can translate to very high spatial resolution in a reflectometer, but the cost of the laser source is very high and suppliers are limited. A standard distributed feedback (DFB) laser is much less expensive and can be tuned over a smaller wavelength range, but the DFB laser tunability is sufficient for resolution in the region of 1 cm or less. However, the DFB source does not typically provide sufficient coherence to be used for measurements beyond about 1 m of fiber length.

To support continued large-scale FO deployment, such as in communications networks from homes to data centers, there is an identified need for testing these FO installations at much lower cost, and with high resolution to localize faults in these more compact environments.

SUMMARY

In the view of the above, the present disclosure provides a new integrated optics reflectometer which is able to further develop optical communications at high reliability levels in a cost effective manner.

To support continued large-scale FO deployment for communications, sensing, advanced lighting systems and other FO platforms, the integrated optics reflectometer of the present disclosure enables the optical integrity of FO installations to be tested at high resolution and much lower cost. The integrated optics reflectometer of the present disclosure provides inexpensive optical measurements with <1 cm resolution at a range of one or more kilometers. The integrated-optics reflectometer provides a complete and/or customizable solution.

Therefore, to assist current and future FO installations operate at peak efficiency, the integrated optics reflectometer makes it easier for network operators to quickly identify where fiber connectivity problems exit. Likewise, one key area of improvement, addressed by the present disclosure, is the reduction in the cost of high-resolution communication test and measurement devices. The integrated optics reflectometer of the present disclosure supports large scale FO network deployment with a reflectometer having high resolution and moderately short range to be used in the maintenance of FO networks. This technology supports new FO networks being installed in neighborhoods, office buildings, fiber-to-the-home, local area networks, wide area networks, and mobile self-contained FO platforms including aircraft, ships, etc. Some of these FO platforms extend at most a few hundred meters (<1 Km) and an optical interrogation system is desirable to locate optical faults to within less than 1 centimeter to make necessary repairs to maintain overall optical network integrity.

The present disclosure provides that the laser output is monitored using an interferometer (e.g., a measurement unit), and a feedback correction is applied to the detected signal before the light is used in the reflectometer. The interferometer is utilized to measure the instantaneous wavelength/frequency of the laser source, to determine whether there is a deviation between an actual frequency of laser light outputted by the laser source at that instant and a target frequency of the laser source. The output of the interferometer can be considered to be an "error signal" as it represents a deviation between the actual frequency and the target frequency of the laser source. Based on a measured deviation between the actual and target frequencies in the interferometer, a feedback correction is applied in real time to the laser source to adjust and correct the laser frequency to the target frequency, and thereby obtain a highly coherent lasing frequency output from the laser source.

Accordingly, the present disclosure utilizes a phase/frequency control feedback mechanism based on lasing frequencies monitored with an interferometer, to yield a corrected signal that works for all points in a long fiber (e.g., one or more kilometers) in one single measurement. High feedback correction gains are made possible by using an optimized feedback phase response to correct for laser fluctuations. The same feedback mechanism also provides a point in which to inject a wavelength control signal to ensure control linearity and provide for accurate measurement results beyond the natural coherence length of the DFB laser source.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure are described with reference to the drawings. The following description sets forth specific details, such as particular embodiments, procedures, techniques, etc. for purposes of explanation and not limitation. It is to be understood that the embodiments described hereinafter are exemplary, and other embodiments may be employed apart from these specific details. In some instances, detailed descriptions of well-known methods, interfaces, circuits, and devices are omitted so as not obscure the description of the present disclosure. Moreover, individual blocks are shown in some of the drawings. One skilled in the art will appreciate that the functions of those blocks may be implemented using individual hardware circuits, using software programs and data recorded on a non-transitory computer-readable recording media, in conjunction with a suitably programmed digital microprocessor or general purpose computer, using application specific integrated circuitry (ASIC), and/or using one or more digital signal processors (DSPs).

In the description of exemplary embodiments of the present disclosure, examples of types of laser sources are provided, such as diode lasers including DFB lasers. It is to be understood that these are given as examples of laser sources, and the present disclosure is not limited thereto.

At the outset of the detailed description of the present disclosure, a discussion of the principles of OFDR is provided with reference to various examples to better illustrate the unique solution of the present disclosure.

Reflectometers are used to examine the characteristics of waveguides along their length, by analyzing reflections of a signal injected at one end. In the OFDR, the signal is coherent light with a steadily changing optical wavelength (or optical frequency).

In one OFDR example, the light may be steadily increasing in optical frequency at a rate of 10 MHz per microsecond from a nominal frequency of 200 THz (1500 nm wavelength), and this frequency sweep may be maintained for a duration of 1000 microseconds. Light which is reflected from a discontinuity (e.g., a defect, connector, end face, etc.) in the fiber at a distance of 1 km will experience a round trip delay of approximately 10 us (using a typical value for the speed of light in fiber). Thus, while the optical frequency is sweeping, the reflected light will be from the laser source at a time when the generated optical frequency was 100 MHz slower. This particular frequency difference between the reflected light and the current laser output frequency will be a characteristic of all light from this distance for as long as the sweep is maintained. Light reflected from all other distances will have a different characteristic difference frequency.

Optical frequency/wavelength can be difficult to measure directly with high resolution, but very small frequency differences can readily be detected between two light sources by interference. In this case, the reflected optical energy can be interfered with some of the light taken from the laser directly. This arrangement is sometimes called self-heterodyning. The difference in optical frequencies between these two interfering light signals produces an interference beat, or intensity modulation frequency equal to the optical frequency difference of the two light input signals. The optical intensity modulation after interference can be converted into an electrical signal using a photo-detector, and moving the signal to the electrical domain is useful as we have better tools for further processing in this domain. The reflection from a point 1 km distant now produces a signature 100 MHz electrical signal in this arrangement. Its frequency identifies where the reflection came from, and the amplitude of the beat frequency indicates the strength of the reflection at that point. It is apparent that a frequency spectrum of the signals from the photo-detector now comprises an analog of the reflection profile of the fiber along its length, where zero frequency represents the launch end and the fiber length is represented on a scale where 100 MHz=1 km (i.e. 100 kHz/m). This frequency spectrum is often generated by a fast Fourier transform (FFT) of the beat signal from the detector.

In the above, it was assumed that the laser light is coherent. Thus, the laser is an optical frequency oscillator where its phase can be predicted for any length of time into the future. This, however, is not the case in practice, as all oscillators are subject to some disturbances and the oscillating phase of the semiconductor laser in particular is disrupted by spontaneous emissions into its cavity. While stimulated photon emissions add to the lasing wave energy with constructive phase, each spontaneously emitted photon has a random phase and thus adds a small disturbance of random sign and amplitude to the lasing phase. In the course of time, the effect of these random disturbances is to cause the laser phase to wander away from the ideal target phase (i.e. had it been perfectly coherent) in a "random walk" fashion. If the random contribution is very small, it might be possible to predict the laser phase some useful way into the future. This valid prediction time is the laser coherence time. It can also be expressed as lasing coherence length by dividing coherence time into the speed of light. Thus, for example, a laser with coherence time of 3 µs has a coherence length in air of 1 km. Taking the example above and assuming a laser of coherence time 3 µs, the coherence length in fiber is about 600 m (the speed of light being slower in fiber) so we could make reflectometer measurements to a distance of 300 m in fiber (i.e. 600 m round trip). A laser with longer coherence length could then be used to make distant reflectometer measurements.

It is to be noted that the above discussion of coherence may imply that the laser phase is well defined to some time and beyond that time it is unknown, or that the coherence function has a high value to the coherence length and quickly falls to nothing beyond that distance. However, the typical coherence function is Lorenzian in shape and this is a statistical distribution that falls slowly and has a long tail. The coherence "cut-off" point may be defined as the point where the laser light is 50% coherent, or where resulting interference fringes have 50% contrast, but the degree of coherence changes only slowly over a wide range. However, while a single FIGURE for coherence length may be somewhat misleading, it is to be understood that such a FIGURE is provided for the purpose of quantifying coherence length/time. Accordingly, in describing the OFDR operation, the numbers used may be approximated to a degree, but such approximation does not affect the use or understanding of such coherence lengths or times as discussed herein.

As described above, any physical point along the fiber length is identified with a particular frequency after self-heterodyne detection. While this characteristic frequency is proportional to distance, it is also proportional to the rate of change of lasing optical frequency. In order to maintain high resolution, exemplary embodiments of the present disclosure provide that the detected frequency from that point is made constant. If in the example above, it is desired to resolve the reflection at a point 1 km distant to 1 cm (1 part in 100,000), an optical frequency sweep-rate linearity of 1 part in 100,000 would be required. However, tunable lasers cannot readily be tuned with this degree of tuning linearity.

Measurement distance may be limited by laser coherence, as noted. There are three main techniques to overcoming this limitation: 1) by using a higher coherence tunable laser source as described above, 2) by compensating the raw measurement data for laser incoherence before interpreting results, as disclosed, for example, in U.S. Pat. No. 7,515,276 to Froggatt et al. (hereinafter "Froggatt"), or 3) by correcting the laser incoherence at the laser source, according to the solution of the present disclosure as described in more detail below.

Technique 1) is a viable solution, and there are some high quality tunable laser sources that can produce similarly high quality measurement results with a measurement range of many km, but these lasers, which are often micromechanical structures including laser devices combined with MEMS components and mirrors, are generally expensive to manufacture. By contrast, a common DFB semiconductor laser of moderate quality is manufactured at a much lower cost as an optical source for telecommunications systems. DFB lasers have a coherence length that more typically permits OFDR measurements over a very limited span of approximately 1 m, and this is not often a useful range.

Technique 2) of Froggatt has been used as a means to allow inexpensive DFB lasers to be used in making long length measurements. In principle, the technique of Froggatt involves measuring the laser phase variations with time and recording the measurements electronically so that there is a historical record of the actual laser phase (or an approximation) that can be used to compensate the readings at the detector to some point in the recent past. Accordingly, Froggatt proposes to monitor the DFB laser phase with an interferometer and then use that information, which has been digitally delayed, to generate a historical record of phase/frequency evolution, and then, based on that historical record, empirically compensate OFDR readings from a region of fiber beyond the laser coherence length. The delay used for the laser monitor data is equal to the delay to the compensated region, as a correction term in actual reflectometer measurements at distances beyond the coherence length of the laser, but the compensation only applies to a small window size around the compensated delay, and to view the whole fiber length one must make many partial readings.

The present disclosure provides a new technique of monitoring the laser phase evolution and using this information immediately in a feedback loop to correct the laser phase variations and thereby increase the laser coherence length/time. By correcting the laser behavior at the laser source, the measurement data gathered will be applicable over the full measurement length, as in the system using a highly coherent tunable laser source according to technique 1) above. The present disclosure provides that the laser output is monitored using an interferometer, and a feedback correction is applied to the laser source to correct its optical frequency. Accordingly, the present disclosure utilizes a phase/frequency control feedback mechanism based on lasing frequencies monitored with an interferometer, to yield a corrected signal that works for all points in a long fiber in one single measurement. High feedback correction gains are made possible by using an optimized feedback phase response to correct for laser fluctuations. The same feedback mechanism also provides a point in which to inject a wavelength control signal used to provide the optical frequency sweep required in order to use this DFB laser as an OFDR optical source.

Figure 1A:
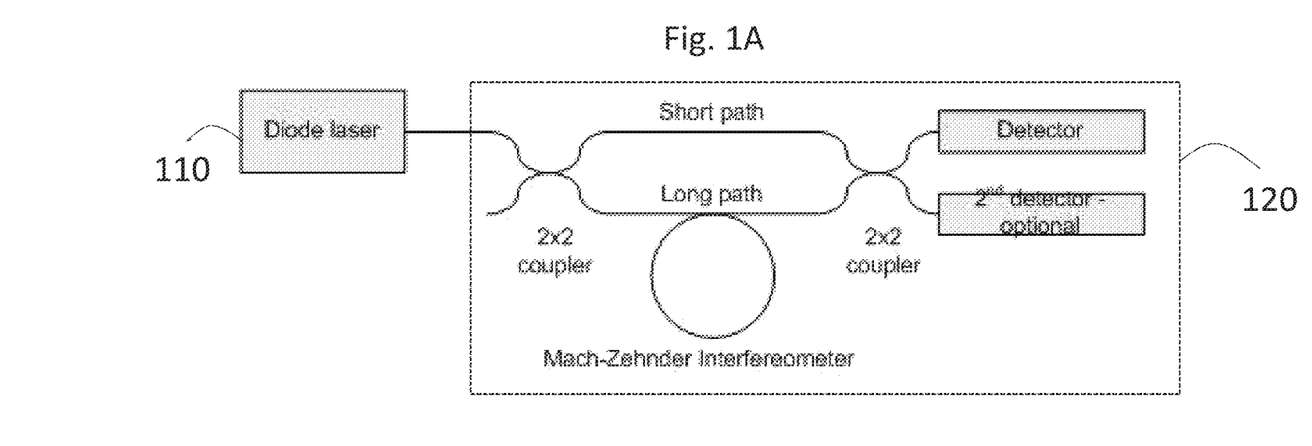
FIG. 1A illustrates an arrangement of a laser source an a measurement unit (e.g., an interferometer)

FIG. 1A is a block diagram of an arrangement of a laser source 110 and a measurement unit 120 (e.g., an interferometer). The laser source 110 has a target frequency, but as noted above, the laser source does not always output laser light at this target frequency. The measurement unit 120 is configured to measure a deviation between an actual frequency outputted by the laser source 110 at a current instant in time and the target frequency of the laser source 110.

An example of an interferometric measurement on laser output to monitor (e.g., detect) the optical phase/frequency of the laser source 110 will now be described with reference to FIG. 1A, to illustrate how this monitoring is used to provide real-time feedback control for the laser source 110.

Instantaneous laser phase and/or optical frequency can be monitored using an interferometer on some light output from the laser source 110. In a Mach-Zehnder interferometer, for example, of the measurement unit 120, the laser light may be split into two paths, one short and one longer, and then recombined. When the light is recombined, interference takes place and this may be constructive or destructive. In accordance with an exemplary embodiment, the interferometer can be built from fiber and 2×2 fiber couplers. The first 2×2 coupler splits laser light into two fiber paths. One input of a second 2×2 coupler is fused directly to one output the first coupler, while the other input and output pair are connected via an additional length of fiber. One or both of the outputs of the second 2×2 coupler may be connected to a photo-detector to monitor the interference result. If the path length difference from input to one output of this interferometer is an exact number of wavelengths, then interference at that output will be constructive and the light output will be maximum (approximately equal to the total input light level), while the path length difference at the other output of the interferometer will necessarily be one half-wavelength different (if these are equal split ratio 2×2 couplers this will be the case—the optical delay difference may not be apparent but it occurs in the couplers) and the second output level will be close to zero. If the wavelength changes such that the first path length is one half wavelength longer than above, then the first output will be zero (destructive interference) and the second output will be maximum (constructive interference). At points in between the two conditions above, the intensity at either output will be a function of the lasing wavelength, and if the fiber length difference is many wavelengths of light then the output intensity can be a very sensitive function of optical frequency. It is also taken into account that on a shorter timescale, short compared with the propagation delay time through the path difference, the output intensity is a direct function of the laser instantaneous change of phase as light from the longer path has not yet experienced that phase change.

Figure 1B:
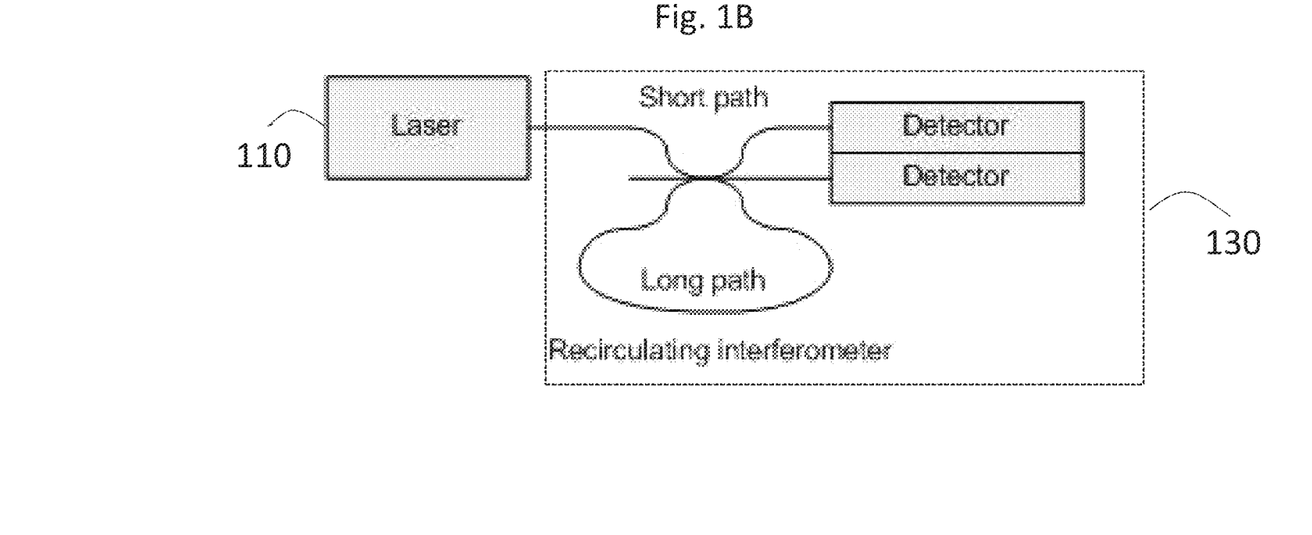
FIG. 1B illustrates an arrangement of a laser source and a measurement unit (e.g., an interferometer)

FIG. 1B illustrates a block diagram of an alternative embodiment in which the measurement unit 130 includes a recirculating interferometer instead of the Mach-Zehnder interferometer illustrated in FIG. 1A. Nevertheless, the measurement units 120, 130 in FIGS. 1A and 1B are each configured to measure a deviation between the frequency outputted from the laser source 110 at the current instant of time and the target frequency of the laser source 110.

Figure 2:
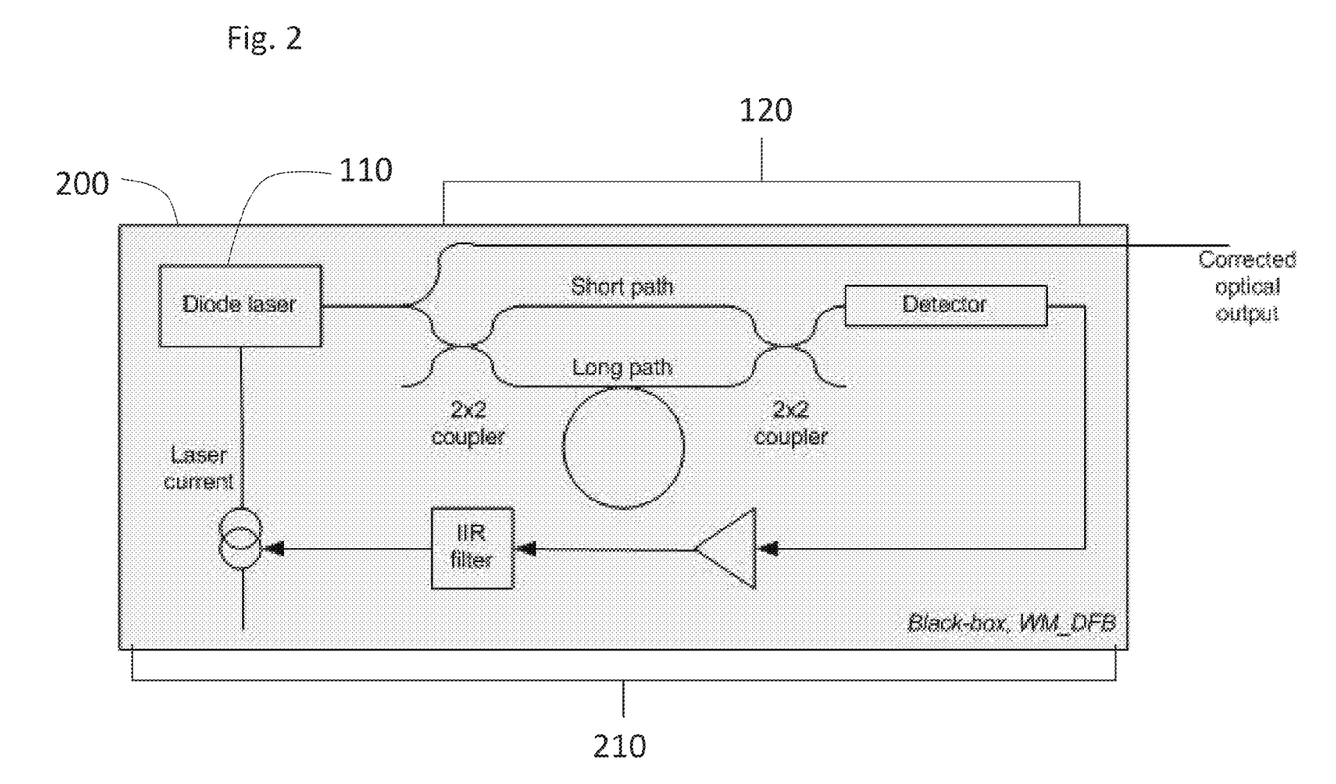
FIG. 2 illustrates a block diagram of an integrated optics reflectometer according to an exemplary embodiment of the present disclosure.

FIG. 2 illustrates an exemplary embodiment of a an apparatus 200 including a laser whose optical frequency is stabilized and thus its coherence length increased according to the present disclosure. The apparatus 200 utilizes the interferometer 120 of FIG. 1A to monitor the lasing frequency of the laser source 110, and the interferometric measurement is fed into a phase/frequency control feedback mechanism to control in real-time the frequency/wavelength of the laser light output by the laser source 110. Reference numeral 210 in FIG. 2 denotes a feedback control unit which is configured to, based on a measured deviation between the actual and target frequencies of the laser source 100 by the interferometer 120, control the laser source 110 in real time to maintain a constant frequency of laser output from the laser source 110 so that the frequency of laser light transmitted from the laser source 110 is adjusted to the target frequency. The output of the interferometer 120 can be considered to be an "error signal" as it represents a deviation between the actual frequency and the target frequency of the laser source 110. Based on a measured deviation between the actual and target frequencies in the interferometer, the feedback control unit 210 applies a feedback correction in real time to the laser source 110 to adjust and correct the laser frequency to the target frequency, and thereby obtain a highly coherent lasing frequency output from the laser source 110.

As noted above, the time evolution of laser phase/frequency, as measured by an interferometer, is based on reflected (delayed) signals which are self-heterodyned with the laser light generated at different instances in time. In accordance with an exemplary embodiment of the present disclosure, the real-time measurement of laser frequency is used immediately in a feedback loop to instantly (e.g., by the infinite impulse response (IIR) filter illustrated in FIG. 2) correct the frequency error between the target and actual frequencies of laser light outputted by the laser source 110.

This is achieved by providing two design characteristics. First, the optical frequency detection and feedback loop must incur minimal delays, small compared to the bandwidth of corrections required. This necessitates short fiber lengths (if fiber is used, else an integrated optic implementation can be used to keep waveguide lengths small) used in the interferometer and feedback detector(s) and high speed, low latency electronics used in the feedback loop. Second, there is provided a means of applying corrective tuning to the laser source 110 with sufficient bandwidth to correct frequency errors as they occur. DFB lasers are commonly tuned by change of temperature, e.g. using an attached Peltier cooler, but this has a time response on the scale of seconds and is too slow for use in our feedback design. A DFB laser may also be tuned slightly by the current flowing in the laser (a change of current also modulates the light intensity from the laser) and this is the mechanism applied in the present disclosure. The primary effect here is temperature changes from the laser current heating, but there are also more rapid changes in the electron number in the laser cavity which affects the refractive index and thus the lasing wavelength. The present disclosure exploits the mechanisms available to close the feedback loop and to minimize the disruptions to laser phase that otherwise result in low coherence length. Some short term (on a scale of nanoseconds) laser phase noise can be tolerated, but the feedback loop restores laser frequency quickly to maintain coherence on the timescale of microseconds to tens of microseconds. This coherence characteristic makes the laser suitable for the OFDR instruments.

It has been observed that tuning linearity is important for a high resolution instrument. Most tunable lasers (including the "high quality" devices mentioned above) have modest tuning linearity, but nonetheless are inadequate for many OFDR measurements. Lasers are tuned by adjusting temperature, by adjusting angles of MEMS mirrors and gratings, etc. These "open-loop" mechanisms have some non-linearity. The solution of the present disclosure is to apply lasing frequency control within the feedback loop discussed above.

The feedback stabilization technique of the present disclosure, as described above, is effective in stabilizing phase at only one fixed frequency. Frequency tuning can be added to this by varying the optical phase at which the feedback loop locks. For example, a quadrature phase feedback loop with digital phase rotation can be provided for precision tuning.

One means of implementing this frequency control using the feedback loop involves tuning by stretching the interferometer's long fiber, which works as follows: The feedback loop is satisfied by some voltage at the output of the feedback photo-detector. This voltage is generated by a certain phase relationship between light in the short and long arms of the interferometer. If the fiber is stretched then in order to maintain this phase relationship, the wavelength is increased so that the same number of wavelengths fit into the new fiber length with the same phase relationship at the output coupler. If this is not achieved, then the detector output voltage changes and the laser current changes to pull the lasing frequency so that the condition is restored, by which the laser wavelength will be adjusted to satisfy the new long fiber length. The fiber can be stretched by the small amount necessary to effect this tuning by wrapping it securely onto a Piezo cylinder, for example, and changing the dimensions of the cylinder by an applied voltage. The laser tuning range is limited by the current tuning range that can be achieved in the laser source 110 used. The degree of stretching required to reach this limit is rather small compared to the strain that can be withstood by the fiber. This wavelength tuning mechanism was demonstrated in a model illustrated in FIG. 3, which shows a MATLAB Simulink electro-optical model of a wavelength managed DFB laser with a test fiber interferometer for laser source interrogation.

According to an exemplary embodiment, another technique of tuning includes rotating the phase of the feedback locking condition. A quadrature interferometer output can be achieved by various means, for example, by using an equal split 4×4 coupler for the output coupler of the interferometer. According to an exemplary embodiment, this coupler can have four outputs that represent combining the two light paths in four quadrature relationships. An orthogonal pair of these can have a 90 degree relationship in their output intensity. By detecting both of these, a rectangular coordinate representation of the optical phase relationship in the interferometer is obtained. These detector outputs can be summed in the appropriate (e.g., rectangular to polar mapping) ratio to satisfy any phase relationship when the feedback loop is locked. By rotating the rectangular to polar mapping, the locking optical phase can be made to rotate, and the laser wavelength will change to satisfy the lock condition. Rotation can be through more than 360 degrees, and each complete rotation will add another wavelength into the interferometer imbalance length, ramping the lasing wavelength as it goes. This phase rotation, and laser tuning, can continue until the limit of the laser current tuning range is reached.

Accordingly, the feedback control unit 210 is configured to control the laser source 110 to maintain a linear rate of change in the frequency of the laser light output from the laser source 110. A mapping of at least two quadrature interferometer output signals are added to the interferometer phase so that the feedback loop can be locked with any optical phase relation in the interferometer 120. As a result, the mapping can be rotated to "wind" optical cycles/wavelengths into or out of the interferometer 120. The feedback loop of the feedback control unit 210 adjusts the laser frequency to suit these changes to maintain feedback lock, which results in sweeping the laser frequency with precision.

Each wavelength added to the interferometer imbalance length represents a precision change in lasing wavelength and frequency, thus tuning is very precise as represented by the count of wavelengths "wound" into or out of the interferometer. This may be implemented as a digital and precise tuning mechanism. Interpolation between these integer wavelength counts, controlled by the rectangular to polar mapping, can be achieved using multiplying DACs (digital to analog converters) and digitally controlled. While this is not naturally as digitally precise as counting wavelengths, it can be designed to be accurate and the digital coefficients can be readily compensated to increase precision. The overall result of this technique is a laser that can be tuned (within its current tuning range) with very high digital precision that is sufficient for many OFDR applications without requiring further signal processing or compensation methods. By achieving this, then the combination of laser and feedback mechanism can be used (e.g., as a black box) as being equivalent to a high coherence laser source that can be used to make longer range OFDR measurements directly without further compensation, and with results in each measurement that are valid over the full length of measurement. The remainder of the design to complete an OFDR can thus be quite simple, straightforward, and low cost.

As described above, quadrature information can be generated from the interferometer using a 4×4 coupler. The same result can be achieved by other means, for example, a 3×3 coupler provides an approximation to a quadrature output, but it would, relative to the 4×4 coupler, involve a modified mapping between its output and the phase to be locked. In addition, in the integrated optics reflectometer, the 4×4 coupler may be composed of other elements. For example, it could be built from 2×2 elements.

It may be desirable to achieve a wider tuning range than can be achieved by current tuning alone. In accordance with an exemplary embodiment, temperature tuning can be added inside the feedback loop. Temperature tuning is not inherently sufficiently linear for tuning the OFDR laser wavelength. However, if it is added to a laser that is inside a wavelength control feedback loop as described above, the feedback loop control (current tuning) can generate the correction terms needed to linearize the laser tuning to achieve the same high degree of linearity (as the purely current tuning mechanism above) with a wider tuning range associated with temperature tuning.

One limitation of temperature tuning is a relatively slow response for temperature changes in response to the heating and cooling input. In accordance with an exemplary embodiment, Magnetic Refrigeration can be utilized to change the temperature of the laser chip more rapidly. Magnetic Refrigeration is a phenomenon where the temperature of a material can be changed by the application of a magnetic field. When the field is removed the temperature reverts to the previous value. There is no heat generated or removed, i.e. the process is adiabatic. This implies an "instantaneous" temperature change for an instantaneous change in magnetic field strength. By attaching the feedback stabilized laser to a piece of Magnetic Refrigeration material (e.g, Gadolinium (Gd) or its alloys), then the laser temperature might be changed very rapidly, though not instantly as heat energy still needs to be exchanged between the Magnetic Refrigeration material and the laser chip to change its temperature.

An exemplary embodiment of the present disclosure provides a mechanism to temperature tune the laser source 110 with a temperature adjustment component including a Magnetic Refrigeration material to adjust the temperate of the laser source 110. The temperature adjustment component can rapidly tune the temperature of the laser source 110, independent of or in conjunction with the feedback control unit 210. Accordingly, an exemplary embodiment of the present disclosure also provides an apparatus which includes a laser source (e.g., the laser source 110 of FIGS. 1A and 1B) and a temperature adjustment component including a Magnetic Refrigeration material to adjust the temperature of the laser source and thereby control the frequency of the laser light output from the laser source.

Exemplary embodiments of the present disclosure have been described as being configured to output laser light into an optical component such as a FO installation. However, the present disclosure is not limited thereto. The embodiments of the present disclosure are also applicable to free-standing or stand-off implementations in which laser light is transmitted toward an area of interest through any medium, such as air, for example. As used herein, an optical component can be any one or more of an optical fiber, an optical coupler, an optical connector, an optical switch, an optical integrated optical waveguide, liquid, atmosphere and free space.

An exemplary embodiment of the fiber construction was described above to include, for example, 2×2 couplers. The present disclosure is not limited thereto. For instance, an integrated optics solution can be provided where the laser, couplers, and detectors are integrated onto a small substrate.

Accordingly, exemplary embodiments of the present disclosure combine an electro-optical controller with a standard DFB laser source to manage the wavelength to facilitate an optical frequency sweep with defined coherence that can be used to make reflectometer measurements over long fiber lengths (up to a few km, e.g., 5 km) in one measurement, with resolution in the region of a few mm. The laser control configuration of the present disclosure is modeled using a modeling system that has demonstrated proven accuracy in other optical systems with promising results in FIG. 3.

The reflectometer technique of the present disclosure, which combines an electro-optical controller with a laser source such as a DFB, manages the output wavelength thus facilitating an optical frequency sweep with defined coherence that can be used to make reflectometer measurements over long fiber lengths, e.g., one or more kilometers, with resolution of several mm. Thus, the present disclosure, using optical modeling techniques to evaluate and design DFB line width stabilization, allows wavelength tuning designs with very long coherence time and a wavelength tuning range from a regular telecommunications grade laser source. Accordingly, an exemplary embodiment of the present disclosure provides a laser source configured to output laser light having a coherence length of at least about a hundred meters.

This new reflectometer technology will be able to be deployed as a hand-held/integrated measurement/demodulation tool for neighborhood/office/government FO networks (e.g., WANs, LANs, etc.), as well as mobile self-contained FO platforms including aircraft, ship, terrestrial and other vehicles, and FO sensing. Many of these FO platforms extend at most a few hundred meters (<1 km) and an optical interrogation system is desirable to accurately locate optical faults (within <1 cm) to make necessary repairs maintaining overall FO system integrity not available with current techniques.

Agencies of the U.S. government, for example, uses FO technology for a wide variety of air, sea, ground, and space applications. FO applications can be highly specialized, often with very specific project and scope requirements requiring rigorous testing and harsh environment certification to ensure reliability and performance in the field. For example, aerial vehicles are a rapidly growing application for FO. Utilized as the communications link between ground control and the antenna controlling the UAV, FO provides a very fast and efficient means for transmitting extensive data over long distances. Typically, aerial vehicle FO links for vehicle positioning/control and information/data transmission with high bandwidth and rapid transmission over long distances. For ground vehicles, automotive applications, FO are a naturally ideal choice for lighting, communications, and sensing requirements. Lastly, for ship systems, FO systems have been deployed for mission critical on-board communication systems and ship to shore links to provide data, phone, and other services to docked ships. These connections allow high speed, high bandwidth communications to and from the vessel, without using shipboard wireless transmit/receive systems.

The present disclosure will also serve as the interrogation system for coherent or interferometric measurements such as distributed sensor system using fiber Bragg gratings (FBGs), extrinsic Fabry-Perot interferometers (EFPIs), or other transducers. In a typical distributed fiber sensor system, it is necessary to first provide a means to measure temperature, pressure, stress/strain and vibration in an optical fiber, and second, it is also necessary to provide a means to multiplex several measurements onto one fiber. For example, the wavelength managed DFB laser used with FBG sensor can satisfy both requirements.

Figure 4:
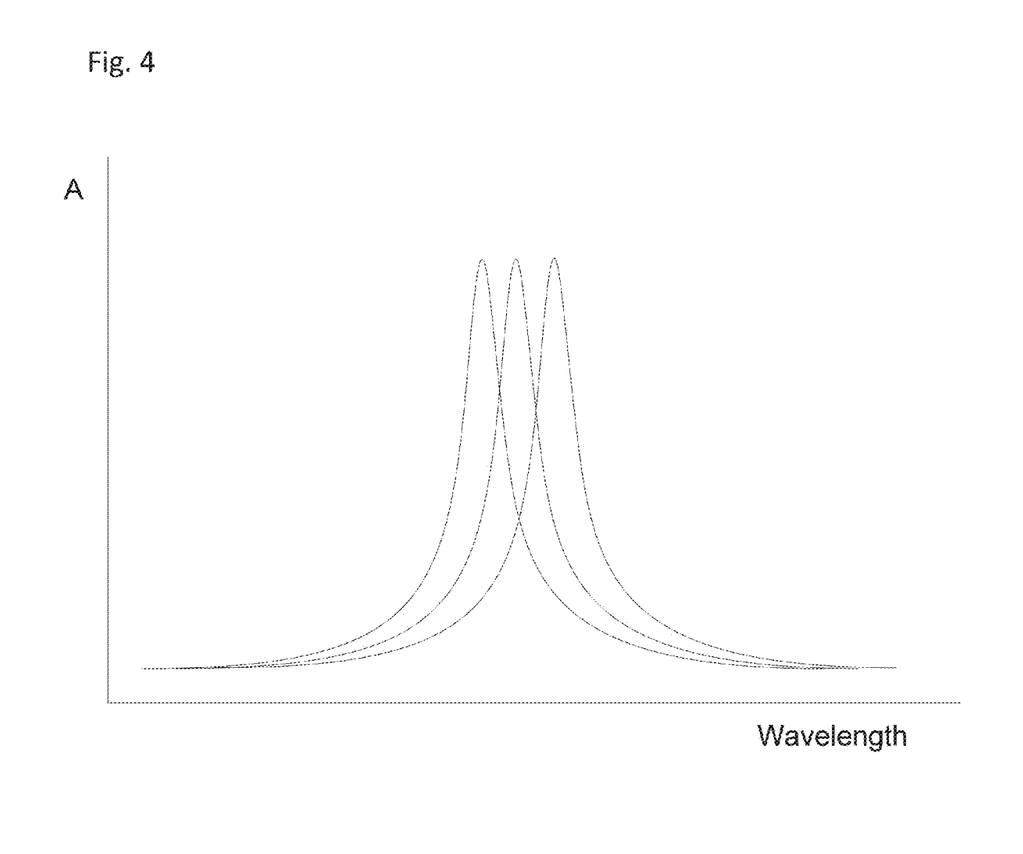
FIG. 4 illustrates fiber Bragg grating (FBG) reflection intensity versus wavelength at three different temperatures.

Firstly, the FBG can be designed to reflect light at a wavelength within the sweep range of the laser, with the reflection wavelength determined by the FBG grating period. Due to strain or changes in temperature the fiber dimensions may change, and/or the core refractive index may change, which modifies the reflected wavelength, as shown in FIG. 4, which illustrates FBG reflection intensity versus wavelength at three different temperatures. By measuring the peak wavelength reflected from the fiber, the strain or temperature at the FBG can be determined. This process requires a tunable laser source, but does not necessarily require high source coherence.

Figure 5:
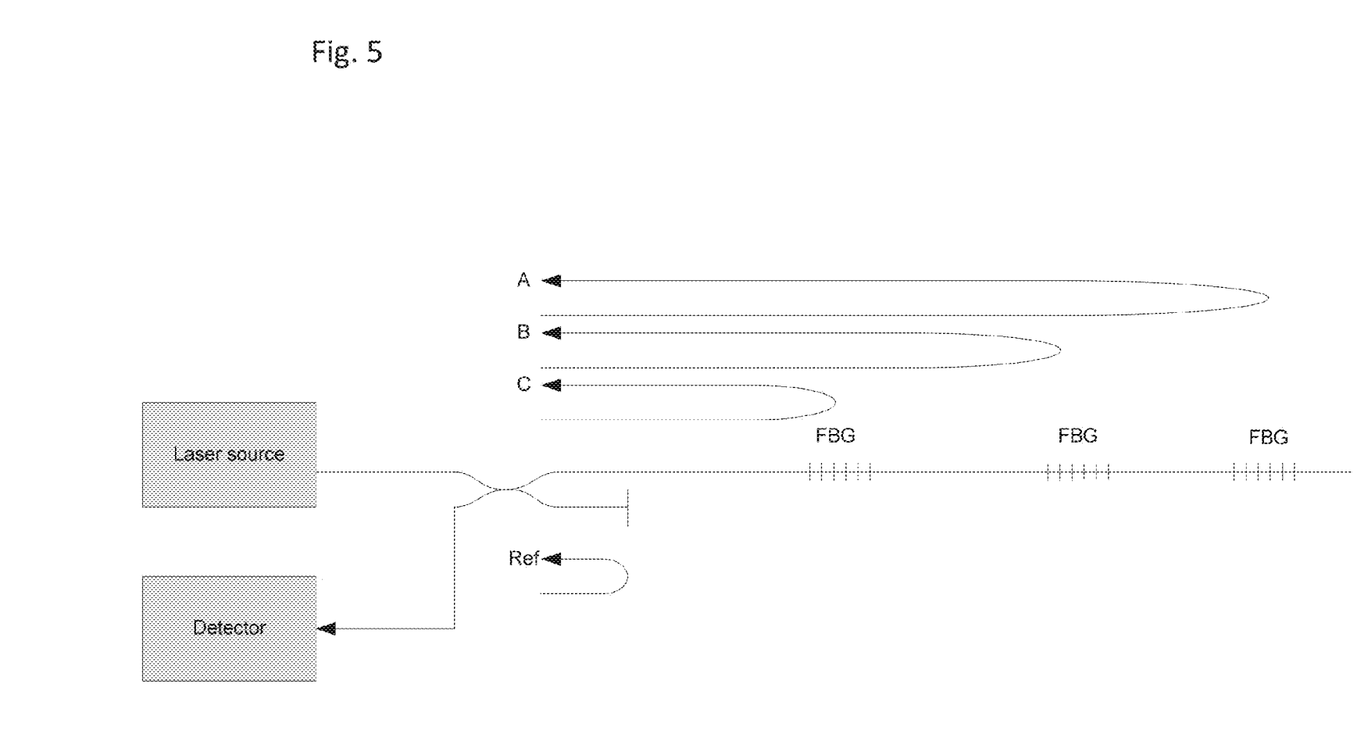
FIG. 5 illustrates returned signals from three FBGs and a reference signal from a wideband reflector.
Figure 6:
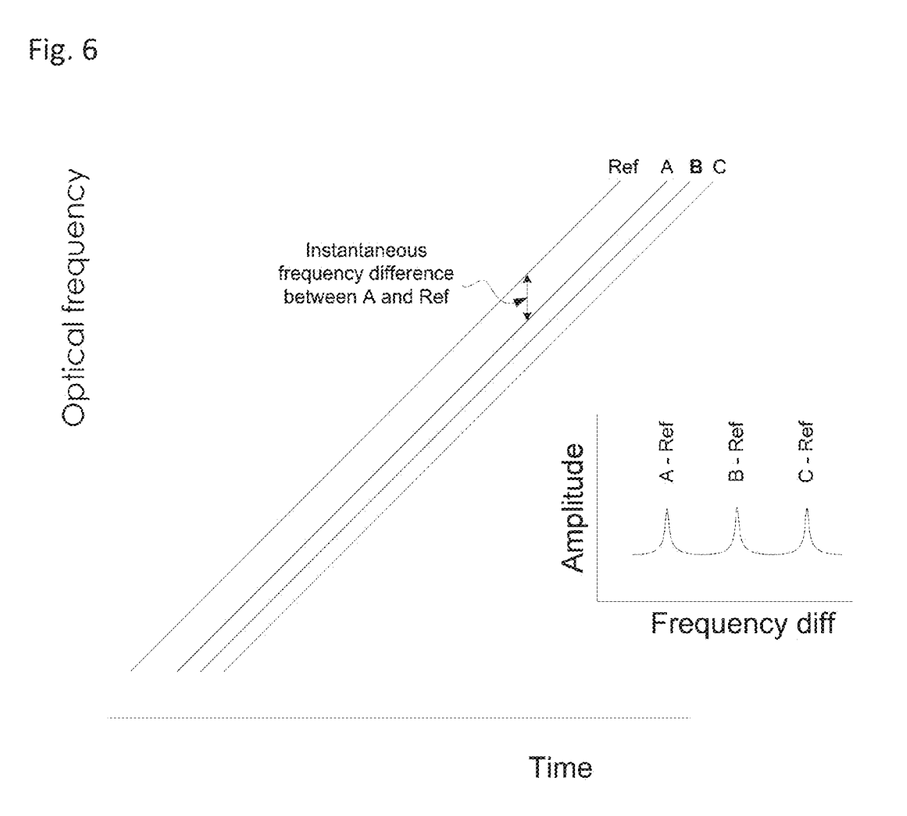
FIG. 6 illustrates a graph showing the laser optical frequency is swept versus time.

If the source wavelength is swept rapidly, then it may be possible to determine the wavelength difference between the laser at the current point in time and any FBG reflected signal which will have the wavelength seen at the source before the round trip delay time to the FBG as shown in FIG. 5, which illustrates returned signals from three FBGs and a reference signal from a wideband reflector. This wavelength difference may be a tiny fraction of the laser wavelength, but may still amount to kilohertz or megahertz in frequency terms, and this frequency range is readily captured and processed electronically. The frequency difference can be detected using coherent optical detection (e.g. by mixing the two light signals on a photo-detector) to produce a beat frequency. Each of the FBGs, located at different points in the fiber, will have a unique round trip distance hence a unique beat frequency shown in FIG. 6, which illustrates the laser optical frequency is swept versus time. Delayed reflections from distant FBGs exhibit an earlier optical frequency which is offset from that of the nearby reference reflector. This system requires a coherent light source to facilitate coherent detection, where the coherence may be (though not necessarily) at least as long as the round trip distance in fiber to the furthest FBG.

While FBGs are used above as an example of an in-fiber transducer there are other possible transducers including EFPIs and even the fiber's own intrinsic backscatter signature. The present disclosure will assist the numerous optimizations to be made to gain best performance taking into account the expected laser tuning range and speed, the particular transducer sensitivity coefficients, the desired system measurement ranges and sensitivities, and the desired measurement spatial resolution and total length.

For sensing applications for the energy market, there is a desire for providing high-resolution strain, temperature, vibration and pressure for the energy generation and distribution industries. Fiber optic sensing systems have been developed to address these markets due to their high level of accuracy and ability to operate in harsh environments even at high temperatures and high pressures. Additionally, transformers, power companies' biggest capital investments, have traditionally been managed manually, retroactively and inefficiently. Next-generation sensors deployed at substations will help utilities avoid unplanned failures, reduce maintenance costs and extend useful transformer life. Wind energy sensing products are being developed that allow for operational monitoring, tracking the condition of the wind generation system. These new sensing applications are being addressed by FO sensing systems which monitor pitch to maximize generator output and load reduction for blades, drive train and tower, while giving cost reduction benefits for the turbine manufacturer. For mobile platforms, health monitoring of airplanes, ships, spacecraft, etc. as well as strain, temperature and other physical parameters will be measured and monitored providing for safer, more efficient transportation systems of the future.

In accordance with the present disclosure, the integrated optics reflectometer will be able to manage the output wavelength of the laser source, thus facilitating an optical frequency sweep with defined coherence that can be used to make reflectometer measurements over long fiber lengths, up to around five kilometers, in one measurement, with resolution in the region of several mm. The laser control configuration has been modeled using a highly specialized optical modeling system that has demonstrated proven accuracy in other optical systems. Using these unique tools, the present disclosure improves upon past DFB line width stabilization and wavelength tuning designs achieving very long coherence time and a small (but sufficient) wavelength tuning range from a regular telecommunications grade laser source.

Figure 3:
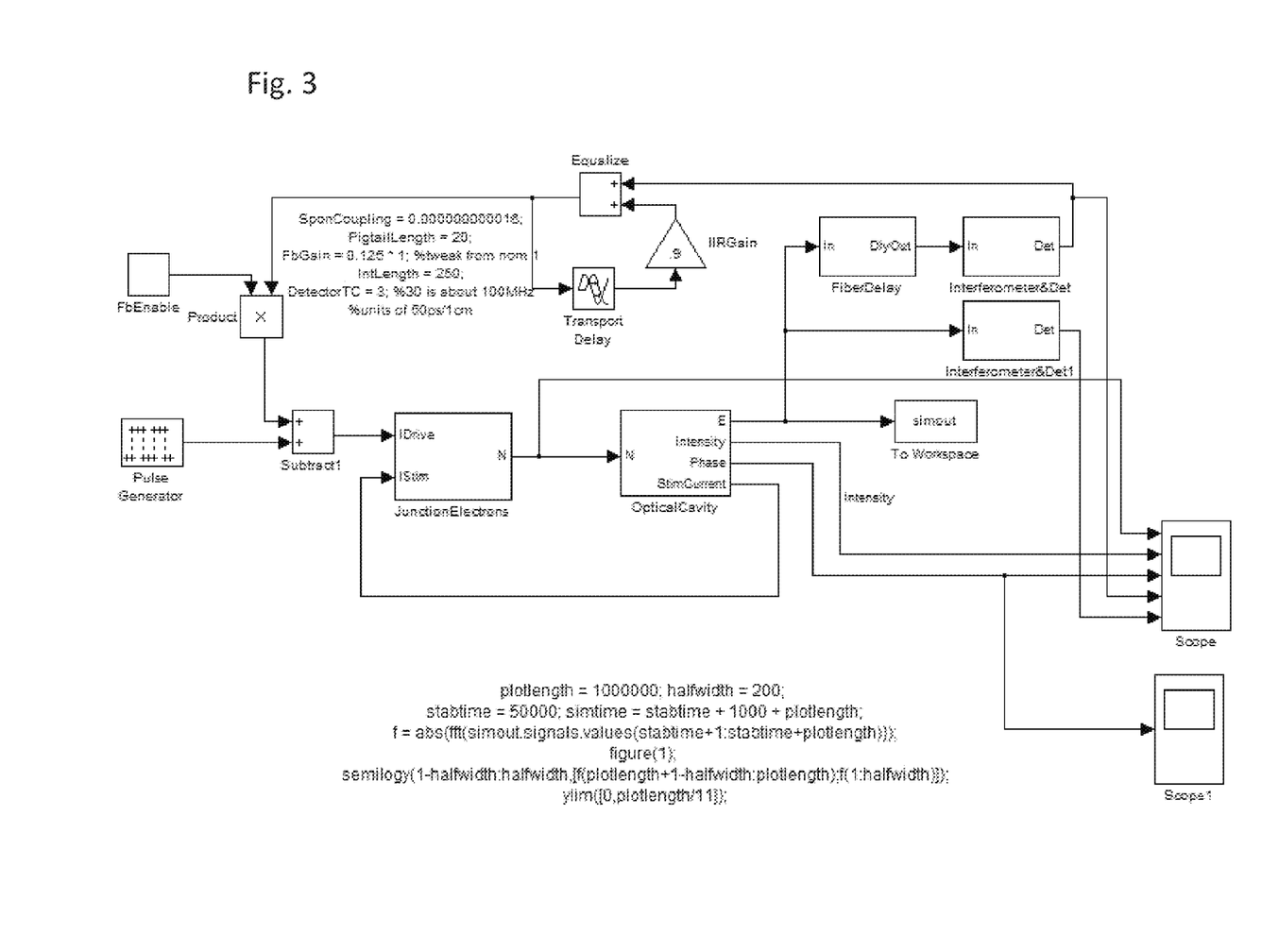
FIG. 3 illustrates a MATLAB Simulink electro-optical model of a wavelength managed DFB laser with a test fiber interferometer for laser source interrogation.
Figure 7:
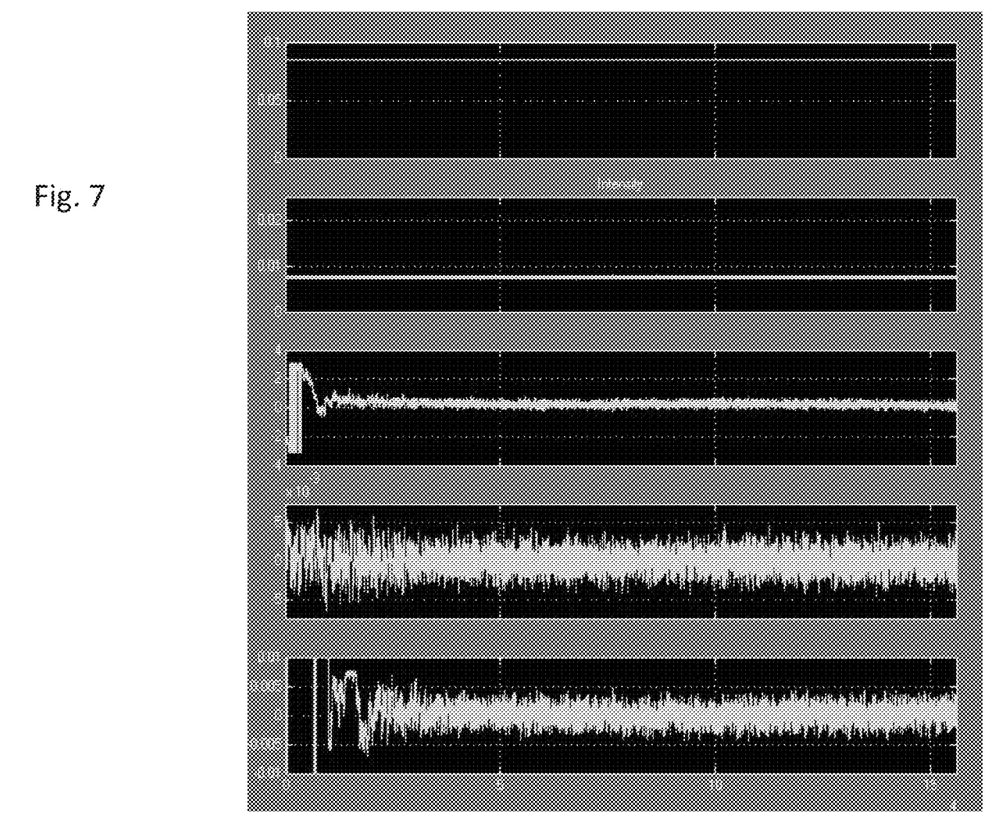
FIG. 7 illustrates simulation plots of the FO testing network device in FIG. 3 showing several key parameters including (from top to bottom) cavity electron number, cavity intensity, cavity optical phase, control interferometer output field and measurement interferometer output field.

FIG. 7 shows simulation plots of the FO testing network device in FIG. 3 showing several key parameters including (from top to bottom) cavity electron number, cavity intensity, cavity optical phase, control interferometer output field and measurement interferometer output field. While not shown here, also monitored will be electrical circuit waveforms (e.g. laser and detector current and voltage).

For the integrated optics reflectometer, an effective light source achieving the best performance from a communications grade DFB laser is utilized. Therefore, figures of merit with which to compare light sources will be performed in order to fine tune the device. One such quantitative figure of merit is laser line width. We can easily measure this by post processing data taken from the model where we can read optical phase directly, and thus can derive a fast Fourier transform (FFT) from this information.

Figure 8:
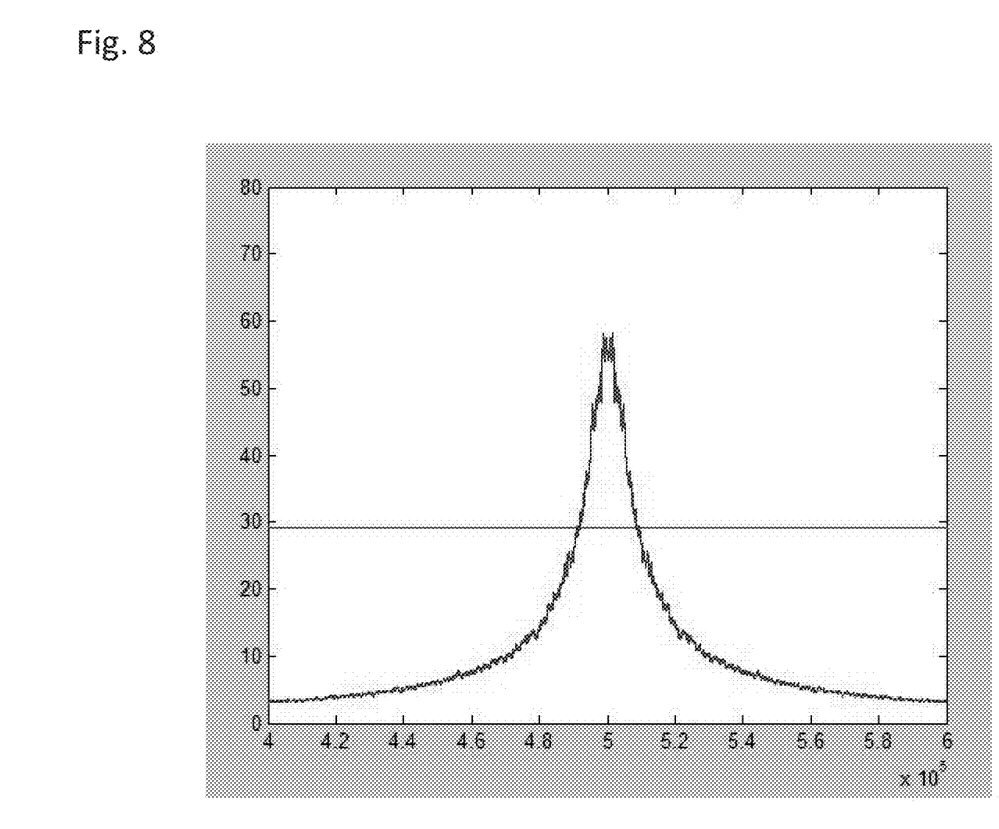
FIG. 8 illustrates an example of post processing data from a test device in order to numerically quantify and compare device performance.

FIG. 8 shows an example of post processing the data from the aforementioned test device in order to numerically quantify and compare device performance. In this case, an FFT of the laser cavity phase gives a measure of the laser line width, which will be reduced to an acceptable value. Data manipulation is well catered for in the Simulink and MATLAB environment where the key to efficient development is an accurate model which is validated against practical, measurable cases.

As noted above, with the physical light source, it is not so easy to measure optical phase directly, and so the laser line width cannot be measured directly. Instead a heterodyne of the laser light with a delayed copy of itself, e.g., self-heterodyne, is used to measure of phase noise. If this is done with a very long delay, well beyond the coherence length of the light source, then the line width measured is as if taking the product of two different sources with the same line width and easily estimate the line width of one of them. However, this can require a very long fiber delay if coherence is fairly high, and furthermore because the typical Lorentizian coherence distribution has a very long tail. Instead, we can use a shorter interferometer to interfere the light with a slightly delayed version of itself and thereby get a measure of phase noise. Fortunately this is a principle that can be model accurately and also realized in practice.

Figure 9:
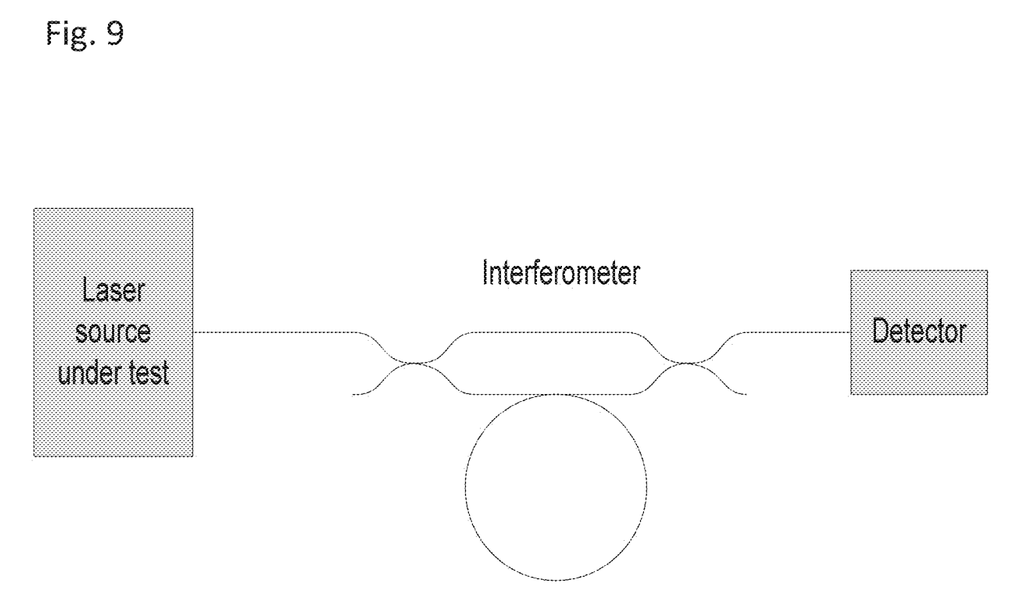
FIG. 9 illustrates a self-heterodyne configuration using an unbalanced Mach-Zehnder interferometer.

In FIG. 9, a self-heterodyne configuration using an unbalanced Mach-Zehnder interferometer is shown, somewhat simplified because in practice it is necessary to ensure polarization matching at the second optical coupler when there is a potential for polarization rotation in the fibers. In the model it is easy enough to ensure this polarization matching by design.

The integrated optics reflectometer of the present disclosure provides a low-cost instrument platform including a reflectometer core module for FO instrumentation. The platform can be integrated into a hand held device with packaging and displays for installation and maintenance crews. The platform can also be used as an integrated part of FO network continuous monitoring systems. The present disclosure provides the network operators with needed data in summary format to facilitate reporting of problems, and provide more detailed reports to provide maintenance crews specific information needed to fix problems. With the high resolution of the present disclosure, they can pinpoint issues within an individual connector or optical component. With the very low cost, integrated optics reflectometer can be integrated across a Research and Education Network (REN), small office/home office (SOHO), LANs, buildings and other markets in multiple locations to ensure network monitoring and reliability. For the first time the present disclosure provides needed instruments at a cost point where they can be designed into new and retrofit into existing networks.

Many of these new FO network platforms are being developed and serviced by small and medium-sized technology companies that have limited resources and capabilities. In addition to the larger customers, when it comes to FO network testing small and medium enterprises (SMEs) face unique challenges. Existing testing equipment in the optical telecommunications market is focused on serving large companies, while these SMEs are underserved. The present disclosure will provide this underserved customer, as well as large customers, with a FO testing solution option at an affordable price while also being available.

The present disclosure satisfies several market desires. For instance, the present disclosure provides an inexpensive instrument development with high resolution (<1 cm resolution at km range) with low per instrument manufacturing cost. The present disclosure also provides a highly flexible and configurable optical network interrogation platform will eliminate the overwhelming myriad of test equipment options and will be compatible with all currently available FO sensing elements (EFPI, FBG, LPG, etalon, dispersion, etc.). In addition, the present disclosure provides either a hand-held configuration or a simple optoelectronics card that can be integrated into the network for monitoring faults and performance as well as sensing systems. Internet downloadable software upgrades can be utilized to keep the equipment at the leading edge of performance.

The present disclosure also provides a method for performing the operative functions of the integrated optics reflectometer as described herein, as well as the uses of the integrated optics reflectometer in an OFDR instrument to measure fiber characteristics.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An apparatus comprising:
 a single laser source configured to output laser light at a target frequency;
 a measurement unit configured to measure a deviation between an actual frequency outputted by the single laser source at a current period of time and the target frequency of the laser source, the measurement unit using an interference pattern produced from the laser light from the single laser source to measure the deviation;
 a feedback control unit configured to, based on the measured deviation between the actual and target frequencies, control the single laser source to maintain a constant frequency of laser output from the single laser source so that the frequency of laser light transmitted from the single laser source is adjusted to the target frequency of the single laser source; and
 a temperature adjustment component including a magnetic refrigeration material attached to the single laser source, the temperature adjustment component being configured to adjust a temperature of the single laser source controlled by the feedback control unit.

2. The apparatus of claim 1, wherein feedback control unit includes an infinite impulse response (IIR) filter configured to compensate for characteristics of the measurement unit utilized for frequency measurement.

3. The apparatus of claim 1, wherein the feedback control unit is configured to stabilize a range of actual frequencies to the target frequency of the single laser source.

4. An apparatus comprising:
a laser source configured to output laser light at a target frequency;
a measurement unit configured to measure a deviation between an actual frequency outputted by the laser source at a current period of time and the target frequency of the laser source; and
a feedback control unit configured to, based on the measured deviation between the actual and target frequencies, control the laser source to maintain a constant frequency of laser output from the laser source so that the frequency of laser light transmitted from the laser source is adjusted to the target frequency,
wherein the feedback control unit is configured to control the laser source to maintain a greater linear rate of change in the frequency of laser light output from the laser source than the laser source not having its target frequency controlled.

5. An OFDR arrangement comprising:
the apparatus of claim 4, wherein:
the OFDR arrangement is configured to output laser light from the laser source to a point in an optical component to be tested distant from the laser source, and measure a difference in frequency between the outputted laser light and an instantaneous frequency of laser light reflected from the point, and
the feedback control unit is configured to maintain a constant distance frequency between the frequency of the laser light output from the laser source and the instantaneous frequency reflected from the point such that the difference frequency is directly proportional to the distance from the laser to the point, and an amplitude of the reflected laser light is proportional to the reflectivity at the point, to characterize a reflectivity profile of the optical component.

6. The OFDR arrangement of claim 5, wherein the optical component is at least one of an optical fiber, an optical coupler, an optical connector, an optical switch, an optical integrated optical waveguide, liquid, atmosphere and free space.

7. The OFDR arrangement of claim 6, wherein the reflectivity profile of the optical fiber is measurable at a length beyond a reflectivity profile measurable by the laser source not being controlled by the feedback control unit.

8. The OFDR arrangement of claim 6, wherein the reflectivity profile of the optical fiber is measurable in a single measurement at a distance greater than 1 m.

9. An apparatus comprising;
a laser source configured to output laser light at a target frequency;
a measurement unit configured to measure a deviation between an actual frequency outputted by the laser source at a current period of time and the target frequency of the laser source; and
a feedback control unit configured to, based on the measured deviation between the actual and target frequencies, control the laser source to maintain a constant frequency of laser output from the laser source so that the frequency of laser light transmitted from the laser source is adjusted to the target frequency,
wherein the feedback control unit is configured to add a mapping of at least two quadrature output signals of the measurement unit to a phase of the measurement unit so that feedback control of the laser source by the feedback control unit is locked with any optical phase relation in the measurement unit.

10. A method comprising:
measuring a deviation between an actual frequency outputted by a single laser source at a current period of time and a target frequency of the single laser source, the deviation being measured using an interference pattern from the laser light from the single laser source; and
controlling, based on the measured deviation between the actual and target frequencies, the single laser source to maintain a constant frequency of laser output from the single laser source so that the frequency of laser light transmitted from the single laser source is adjusted to the target frequency of the single laser source,
wherein the controlling of the laser source comprises adjusting a temperature of the single laser source by a magnetic refrigeration material.

11. The method of claim 10, comprising:
compensating for the controlling of the single laser source via an infinite impulse response (IIR) filter to compensate for characteristics of measurements utilized for measuring frequencies of the single laser source.

12. The method of claim 10, comprising:
stabilizing a range of actual frequencies to the target frequency of the single laser source.

13. A method comprising:
measuring a deviation between an actual frequency outputted by a laser source at a current period of time and a target frequency of the laser source;
controlling, based on the measured deviation between the actual and target frequencies, the laser source to maintain a constant frequency of laser output from the laser source so that the frequency of laser light transmitted from the laser source is adjusted to the target frequency; and
controlling the laser source to maintain a linear rate of change in the frequency of laser light output from the laser source.

14. The method of claim 13, comprising:
outputting, in an OFDR arrangement, laser light from the laser source to a point in an optical component to be tested distant from the laser source;
measuring a difference in frequency between the outputted laser light and an instantaneous frequency of laser light reflected from the point, and
maintaining a constant distance frequency between the frequency of the laser light output from the laser source and the instantaneous frequency reflected from the point such that the difference frequency is directly proportional to the distance from the laser to the point, and an amplitude of the reflected laser light is proportional to the reflectivity at the point, to characterize a reflectivity profile of the optical component.

15. The method of claim 14, wherein the optical component is at least one of an optical fiber, an optical coupler, an optical connector, an optical switch, an optical integrated optical waveguide, liquid, atmosphere and free space.

16. The method of claim 15, wherein the reflectivity profile of the optical fiber is measurable at a length beyond a reflectivity profile measurable by the laser source not having its target frequency controlled.

17. The method of claim 15, wherein the reflectivity profile of the optical fiber is measurable in a single measurement at a distance greater than 1 m.

18. A method comprising:
  measuring a deviation between an actual frequency outputted by a laser source at a current period of time and a target frequency of the laser source;
  controlling, based on the measured deviation between the actual and target frequencies, the laser source to maintain a constant frequency of laser output from the laser source so that the frequency of laser light transmitted from the laser source is adjusted to the target frequency; and
  adding a mapping of at least two quadrature output signals of a measurement unit for measuring the deviation to a phase of the measurement unit so that feedback control of the laser source is locked with any optical phase relation in the measurement unit.

* * * * *